United States Patent [19]

Izumikawa

[11] Patent Number: 5,844,511
[45] Date of Patent: Dec. 1, 1998

[54] INTEGRATED CIRCUIT D/A CONVERTER

[75] Inventor: Masanori Izumikawa, Tokyo, Japan

[73] Assignee: NEC Corporation, Tokyo, Japan

[21] Appl. No.: 799,476

[22] Filed: Feb. 12, 1997

[30] Foreign Application Priority Data

Feb. 14, 1996 [JP] Japan ................................. 8-027076

[51] Int. Cl.⁶ ............................. H03M 1/66; H03M 1/06
[52] U.S. Cl. ........................... 341/136; 341/118; 341/145
[58] Field of Search .................................. 341/133, 136, 341/145, 118, 120

[56] References Cited

U.S. PATENT DOCUMENTS

| 4,594,577 | 6/1986 | Mao | 341/136 |
| 5,001,484 | 3/1991 | Weiss | 341/136 |
| 5,446,455 | 8/1995 | Brooks | 341/145 |
| 5,451,946 | 9/1995 | Smith et al. | 341/145 |

OTHER PUBLICATIONS

Masarau Kokubo, et al., "A Fast–Frequency–Switching PLL Synthesizer LSI with a Numerical Phase Comparator", *IEEE International Solid–State Circuits Conference*, 260–261 (1995).

Peter H. Saul, et al., "Session II: Consumer ICs", An 8b CMOS Video DAC, *IEEE International Solid–State Conference*, 32–33 (1985).

Hiroyuki Igura, et al., "An area–saved PLL circuit with a digital loop filter", *NEC System–ULSI Res. Lab., Microelectronics Res. Labs., NEC Corporation*, 205 Mar. 1995.

*Primary Examiner*—Howard L. Williams
*Attorney, Agent, or Firm*—Scully, Scott, Murphy & Presser

[57] ABSTRACT

A D/A converter implemented by an integrated circuit has a first section for conversion of higher-order N1 bits of an input digital signal to output a first current signal $I_1$, a second section for conversion of lower-order N2 bits of the input digital signal to output a second current signal $I_2$, a dividing section for dividing the second current signal to output a third current signal $I_2 \times \frac{1}{2}^{N2}$, and an adding section for adding the first and third current signal. The D/A converter can be implemented by a reduced number of MOSFETs and has a reduced occupied area.

9 Claims, 5 Drawing Sheets

INTEGRATED CIRCUIT D/A CONVERTER

BACKGROUND OF THE INVENTION (a) Field of the Invention

The present invention relates to a digital-to-analog converter (D/A converter) implemented by an integrated circuit and, more particularly, to a D/A converter having a reduced occupied area.

(b) Description of the Related Art

In a digital control circuit, a D/A converter implemented by an integrated circuit is commonly used to convert an input digital signal into an analog signal so as to control an analog circuit in a digital control format. The D/A converter executes D/A conversion of each bit of an input digital signal into a corresponding analog value, finally adding all of the resultant analog values. In order to improve the accuracy in conversion by the D/A converter, a large number of bits are required in the input digital signal. The large number of bits of the input digital signal generally requires a large scale for the D/A converter.

Examples of conventional D/A converters include ones which output a voltage signal and ones which output a current signal. Kokubo et al. reports the latter type of D/A converter in IEEE ISSCC Digest of technical papers entitled "A Fast-Frequency-Switching Synthesizer LSI With a Numerical Phase Comparator", pp 260–261, Feb. 1995. FIG. 1 shows the D/A converter described in the paper, wherein 20-bit input digital signal is separated into a higher-order 12-bit signal and a lower-order 8-bit signal to reduce the occupied area of the D/A converter. The 12-bit signal is supplied to a first section including X-encoder 101 and Y-encoder 102 to be output through current cell matrix 103 as a current signal, which is converted by operational amplifier 104 into a voltage signal. The lower-order 8-bit signal is supplied to a second section including sigma-delta (ΣΔ) modulator 105, which outputs a 1-bit signal for interpolation of the output of the first section. When the 1-bit signal is high or 1, the output of X-encoder 101 is incremented so as to supply the output of the second section to the first section. The D/A converter of this type, however, has a complicated structure and is not sufficient for reduction of the occupied area.

A D/A converter of the type which supplies a current output signal is reported by Igura et al. in "An area-saved PLL circuit with a digital loop filter", at 1995 IEICE General Conference C-612, March 1995. FIG. 2 shows the D/A converter of this type, which has weighting MOSFETs 201 to 206 each for weighting the output signal corresponding to the bit order of the input digital signal, and PMOSFETs 207 and 208 and NMOSFET 209 for outputting a current analog signal based on the sum of the weighted output signals.

Although the D/A converter as reported by Igura et al. has an advantage of a simplified circuit configuration as compared to the first conventional D/A converter, the simplification is not sufficient. Assuming that the D/A converter receives a 9-bit input signal, the weighting MOSFETs must supply 9-stepped weights so that the most significant bit (MSB) MOSFET must have a gate width (or channel width) 256 (i.e., $2^8$) times as large as the gate width of the least significant bit (LSB) MOSFET, and other MOSFETs must have gate widths corresponding to the bit orders of the MOSFETS. The ratio of the gate width may be implemented by a corresponding number of a unit MOSFETs having a unit gate width.

When the number of the unit MOSFETs having a unit gate width is selected for weighting, the MOSFETs for weighting must include as high as 511 (256+128+- - - +2+1=511) unit MOSFETs in number.

In short, in a conventional D/A converter, the occupied area for the D/A converter increases exponentially as the bit length of the input digital signal increases.

SUMMARY OF THE INVENTION

In view of the foregoing, it is an object of the present invention to provide a D/A converter having a relatively small occupied area and a relatively simple circuit configuration.

The present invention provides a D/A converter comprising a first converter section for converting a higher-order N1 bits of the input digital signal into a first analog signal, a second converter section for converting a lower-order N2 bits of the input digital signal other than the higher-order bits into a second analog signal, a weighting section for weighting the second analog signal relative to the first analog signal based on a ratio of $1/2^{N2}$ to output a third analog signal, and an adding section for adding the first analog signal and third analog signal.

In accordance with the D/A converter of the present invention, the circuit configuration and the occupied area of the D/A converter is significantly reduced compared to a conventional D/A converter.

The above and other objects, features and advantages of the present invention will be more apparent from the following description referring to the accompanying drawings.

DESCRIPTION OF THE PREFERRED EMBODIMENTS

Figure 1:
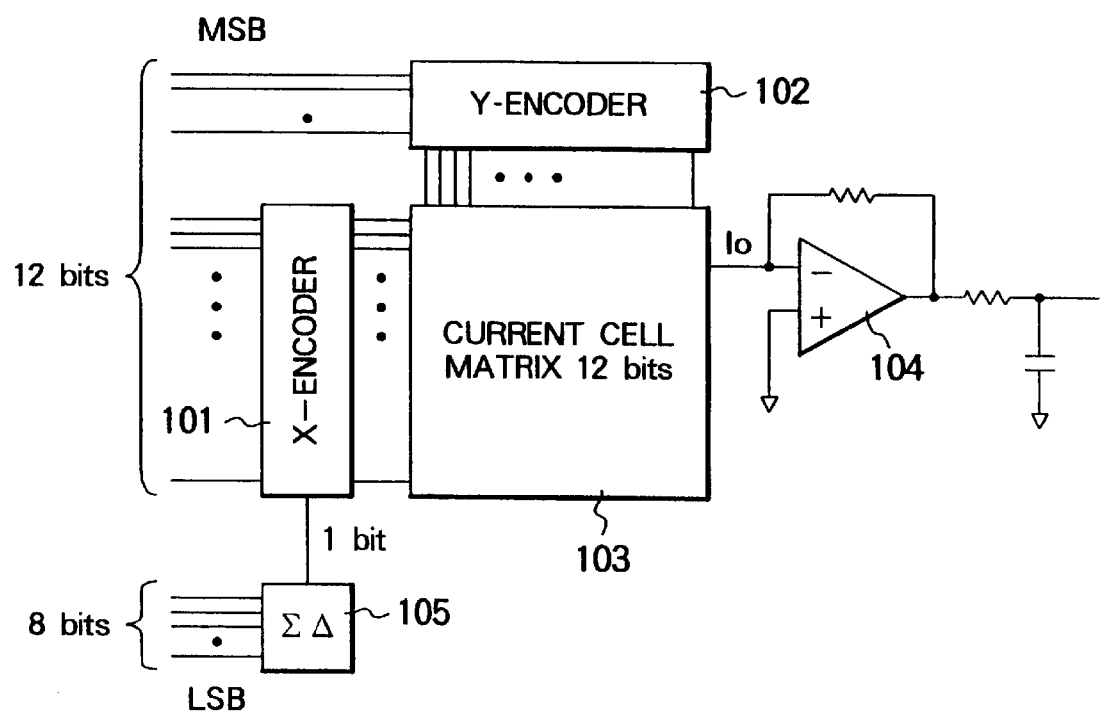
FIG. 1 is a block diagram of a first conventional D/A converter.
Figure 2:
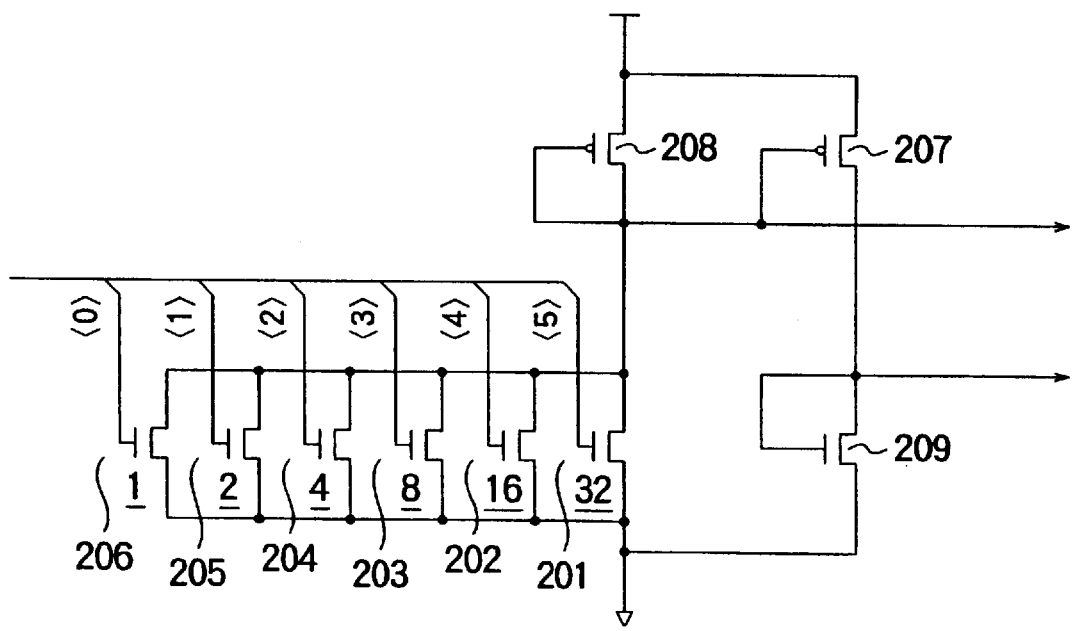
FIG. 2 is a circuit diagram of a second conventional D/A converter.
Figure 3:
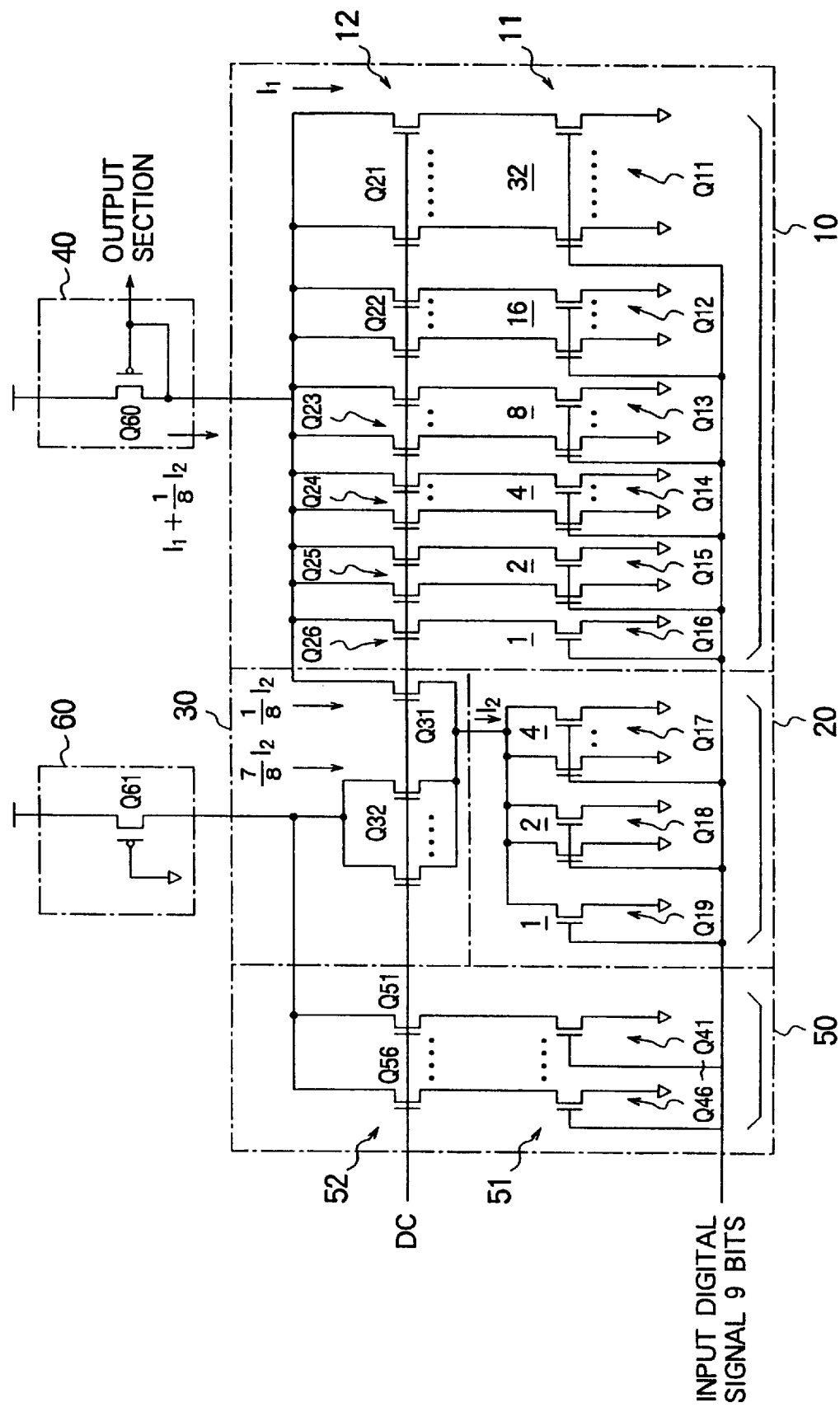
FIG. 3 is a circuit diagram of a D/A converter according to a first embodiment of the present invention.

Referring to FIG. 3, a D/A converter according to a first embodiment of the present invention has a function for converting a 9-bit input digital signal into an analog current signal. The D/A converter comprises as a principal part of the D/A converter a higher-order bits converter section (first section) 10 for converting higher-order six bits of the input digital signal, a lower-order bits converter section (second section) 20 for converting lower-order three bits of the input digital signal, a dividing or weighting section (third section) 30 for dividing the output of the second section 20 by a specified ratio, an adding section (fourth section) 40 for adding the output of the first section 10 and the divided output of the second section 20, and other sections including a compensating section (fifth section) 50 and a current source 60.

The first and second sections 10 and 20 function as current sources for the higher-order six bits and the lower-order three bits, respectively, of the input digital signal. The current output of the adding section 40 is transferred to an output section (not shown) of the D/A converter, which forms a current mirror circuit together with the principal part of the D/A converter shown in FIG. 3.

The first section 10 includes a first MOSFET group 11 including six MOSFET sets (MOSFETs) Q11 to Q16 each having unit-size NMOSFETs (unit NMOSFETs) in number corresponding to the weight of the bit: MOSFET Q11 for MSB includes 32 unit NMOSFETs, MOSFET Q12 for next MSB includes 16 unit NMOSFETs, . . . , MOSFET Q16 includes a single unit NMOSFET, as shown by bottom-barred numerals in FIG. 3. In this manner, each of the MOSFETs Q11 to Q16 functions as a single transistor having a gate width corresponding to the weight of the bit. The gate of each of MOSFETs Q11 to Q16 is supplied with a corresponding bit of the input digital signal, whereas the source of each of MOSFETs Q11 to Q16 is connected to a lower potential line.

The first section 10 also includes a second MOSFET group 12 including MOSFETs Q21 to Q26 each having unit NMOSFETs in number corresponding to the number of the unit NMOSFETs in a corresponding one of MOSFETs Q11 to Q16. Each of the unit NMOSFETs in the second MOSFET group 12 is connected with a corresponding one of unit NMOSFETs in the first MOSFET group 11 of the first section 10 in a cascode fashion. The gate of each of the unit NMOSFETs in the second MOSFET group 12 is maintained at a Dc potential for the cascode connection, whereas the drains of the unit NMOSFETs in the second MOSFET group 12 are connected in common to a drain of a PMOSFET Q60 in the adding section 40.

The second section 20 includes a MOSFET group including three MOSFETs Q17 to Q19 which have configurations similar to those of MOSFETs Q14 to Q16, respectively. The drains of the MOSFETs Q17 to Q19 are connected in common to sources of MOSFETs Q31 and Q32 in the dividing section 30. The gate of each of the MOSFETs Q17 to Q19 is supplied with a corresponding bit of the input digital signal, whereas the source of the MOSFETs Q17 to Q19 are connected in common to the lower potential line.

The dividing section 30 includes a first MOSFET Q31 implemented by a single unit NMOSFET and a second MOSFET Q32 implemented by seven unit NMOSFETs. The drain of the first MOSFET Q31 is connected to the drain of MOSFET Q60 in the adding section 40, whereas the drain of the second MOSFET Q32 is connected to the drain of a PMOSFET Q61 in the current source 60. The source and gate of MOSFET Q61 are connected to the higher potential line and the lower potential line, respectively, to thereby function as a current source. The gates of MOSFETs Q31 and Q32 are maintained at the DC potential for the cascode connection. Thus, the dividing section 30 functions for dividing the output current $I_2$ of the second section 20 at a ratio of 7:1 to provide ⅛ of the output current $I_2$ of the second section 20 to the adding section 40 for weighting the lower-order bits relative to the higher-order bits in addition by the adding section 40.

The compensating section 50 includes a first MOSFET group 51 including MOSFETs Q41 to Q46 having configurations similar to those of MOSFETs Q11 to Q16, respectively, and a second MOSFET group 52 including MOSFETs Q51 to Q56 having configurations similar to those of MOSFETs Q21 to Q26, respectively. The gates of MOSFETs Q41 to Q46 are supplied with the respective higher bits of the input digital signal supplied to the gates of the MOSFETs Q11 to Q16, whereas the gates of MOSFETs Q51 to Q56 are maintained at the DC potential for cascode connection. Each of source-drain path of MOSFETs Q41 to Q46 is connected with the source-drain path of a corresponding one of MOSFETs Q51 to Q56, the drains of which are connected to the drain of PMOSFET Q61. Thus, the compensating section 50 functions for equalizing the voltage drop at the drain of the first transistor Q31 with the voltage drop at the second transistor Q32 of the dividing section for providing the accurate ratio of 7:1 in the dividing section 30 by compensating the output current $I_1$ of the first section 10 affecting the voltage drop at the drain of the MOSFET Q31.

Figure 4:
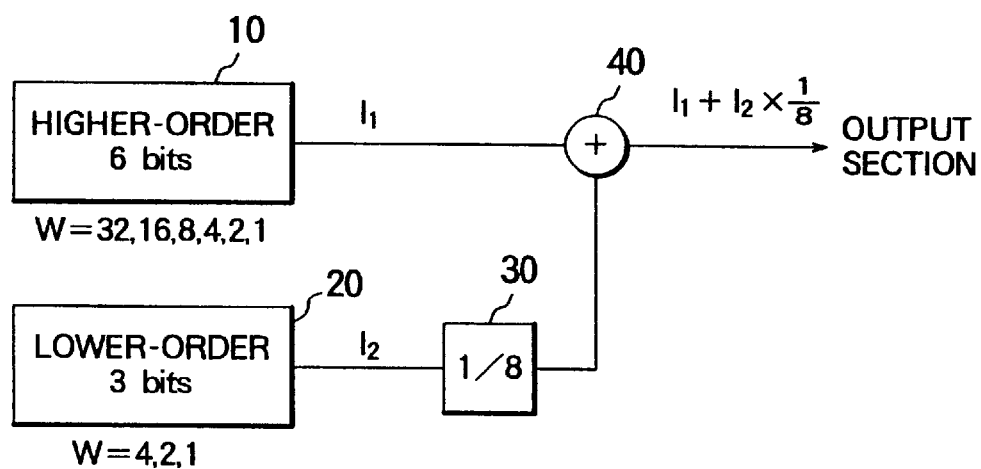
FIG. 4 is a functional diagram of the D/A converter of FIG. 3.

In operation, respective bits of the input digital signal are supplied to the first, second and compensating sections 10, 20 and 50, as shown in FIG. 3. FIG. 4 shows a functional block diagram of the D/A converter of FIG. 3. The first section 10 provides an output current Ii representing the value of the higher-order bits, whereas the second section 20 provides an output current $I_2$ representing the value of the low-order bits. The adding section 40 adds the output current $I_1$ of the first section 10 and ⅛ of the output current $I_2$ of the second section 20 obtained in the dividing section 30 and the total output representing $I_1+I_2\times\frac{1}{8}$ is supplied to the output section of the D/A converter. In this manner, interpolation of the higher-order six bits by the lower-order three bits is implemented by the D/A converter of the embodiment.

In the described configuration of the embodiment, each MOSFET corresponding to each bit is implemented by a less number of unit MOSFETs compared to the case of the second conventional D/A converter wherein weighting of the bits is sequentially implemented from the most significant bit (MSB) to the least significant bit (LSB). That is, the number of the unit MOSFETs in the MOSFET corresponding to the MSB of the input digital signal is reduced from 256 to 32, the unit MOSFET corresponding to the LSB of the input digital signal. The total number of the unit MOSFETs in the D/A converter of the present embodiment is reduced accordingly, to thereby achieve a reduced occupied area of the D/A converter.

Figure 5:
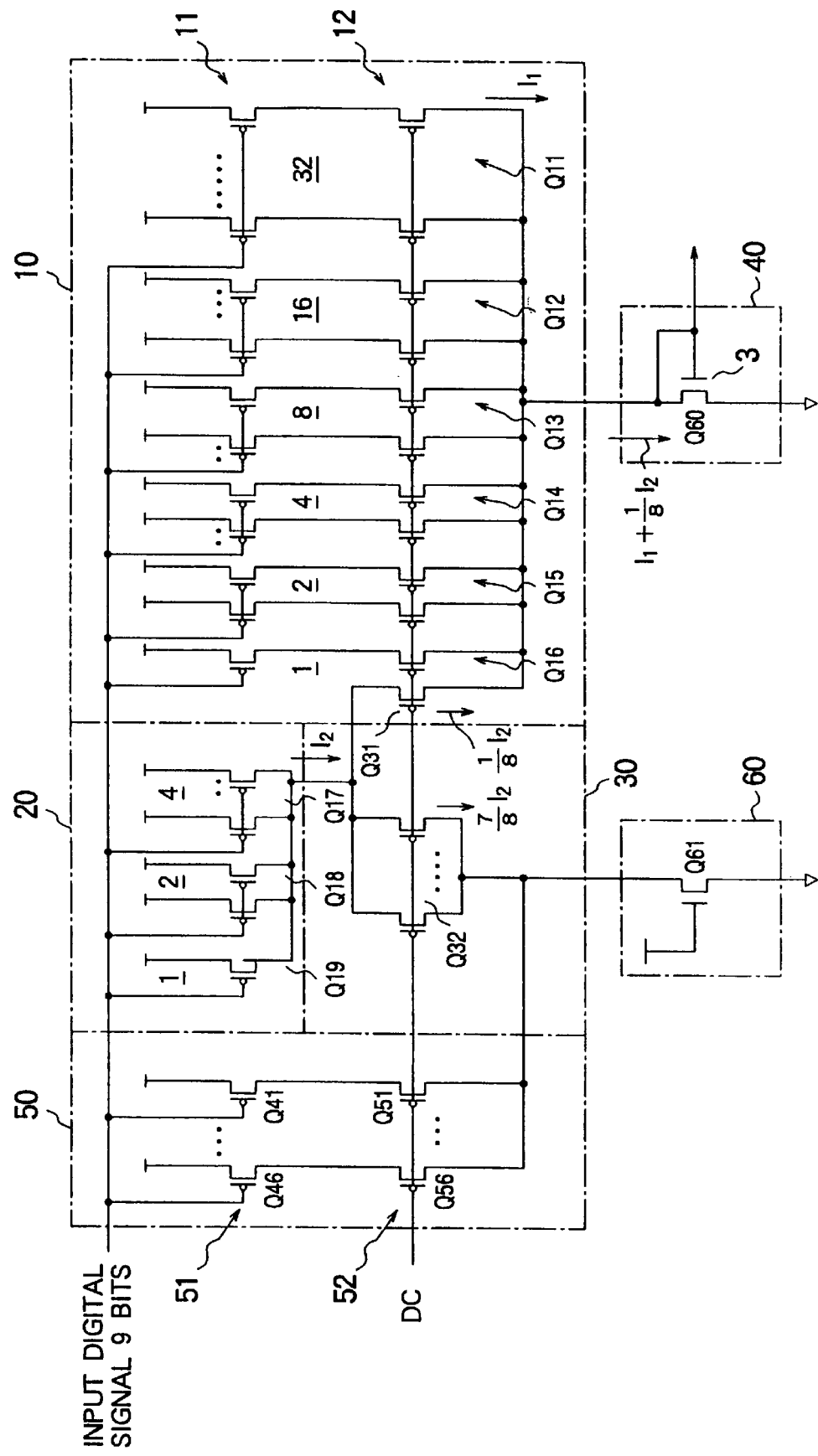
FIG. 5 is a circuit diagram of a D/A converter according to a second embodiment of the present invention.

FIG. 5 shows another D/A converter according to a second embodiment of the present invention, wherein similar constituent elements are designated by the same reference numerals as in FIG. 3. In this embodiment, PMOSFETs are used instead of NMOSFETs used in the first embodiment, NMOSFETs are used instead of PMOSFETs in the first embodiment, and the supply voltage is reversed from the first embodiment in polarity. Other configurations are similar to those of the first embodiment, and detailed description for the second embodiment is omitted herein for avoiding a duplication.

In the embodiments as described above, the weighting for the MOSFETs of the first, second and fifth sections are implemented by a number of unit MOSFETs connected in parallel and having a unit gate width corresponding to the LSB. However, the MOSFETs may have respective gate width corresponding to the weighting for the MOSFETs.

In a more generalized D/A converter for implementing D/A conversion of data having N3 (N3=N1+N2) bits, two current sources outputting the data of higher-order N1 bits and lower-order N2 bits are provided according to the present invention. The adding section adds both the data after weighting the lower-order bits relative to the higher-order bits to implement an interpolation of the higher-order bits based on the lower-order bits. By this configuration, it is possible to reduce the gate width (or number of unit MOSFETs) of each MOSFET corresponding to each bit from $2^{N3}$ to $2^{N1}$ or $2^{N2}$ to thereby reducing occupied area for the D/A converter.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A digital-to-analog converter (D/A converter) for converting an input digital signal into an analog signal, said D/A converter comprising a first converter section having a first configuration of components for converting a higher-order bits of the input digital signal into a first analog signal, a second converter section having a second configuration of components for converting a lower-order bits of the input digital signal other than the higher-order bits into a second analog signal, a weighting section for weighting the second analog signal relative to the first analog signal to output a third analog signal, an adding section for adding the first analog signal and third analog signal, and a compensating section corresponding to said first configuration of components, for compensating the output of said first converter section affecting the weighting in the weighting section.

2. A D/A converter as defined in claim 1, wherein the first and second signals are current signals.

3. A D/A converter as defined in claim 2, wherein said first converter section has a first group of MOSFETs each having a gate width weighted based on a corresponding bit order in the first group and controlled by a corresponding bit of the input digital signal, and a second group of MOSFETs each having a source-drain path connected to a source-drain path of said first group of MOSFETs to pass a drain current for the first group of MOSFETS, and wherein said second converter section has a third group of MOSFETs each having a gate width weighted based on a corresponding bit order in the second group and controlled by a corresponding bit of the input digital signal.

4. A D/A converter as defined in claim 3, wherein each MOSFET of said first, second and third group of MOSFETs is implemented by a corresponding number of unit MOSFETs having a unit gate width.

5. A D/A converter as defined in claim 4 wherein said weighting section divides the output of said second section by $½^{N2}$, given N2 being a bit length of the lower-order bits.

6. A D/A converter as defined in claim 5, wherein said weighting section comprises $2^{N2}$ unit MOSFETS including $2^{N2}-1$ of said unit MOSFETS connected in parallel and one said unit MOSFET for providing said third signal.

7. A D/A converter as defined in claim 3, wherein said compensating section includes a fourth group of MOSFETs corresponding to said first group of MOSFETS.

8. A D/A converter as defined in claim 7, wherein said first converter section has a first group of MOSFETs each having a gate width weighted based on a corresponding bit order in the first group and controlled by a corresponding bit of the input digital signal, and a second group of MOSFETs each having a source-drain path connected to a source-drain path of said first group of MOSFETs to pass a drain current for said first group of MOSFETs, and wherein said second converter section has a third group of MOSFETs each having a gate width weighted based on a corresponding bit order in the second group and controlled by a corresponding bit of the input digital signal.

9. A D/A converter as defined in claim 8, wherein each MOSFET of said first to fourth group of MOSFETs is implemented by a corresponding number of unit MOSFETs having a unit gate width.

* * * * *